United States Patent [19]
Tandy

[11] Patent Number: 6,166,328
[45] Date of Patent: Dec. 26, 2000

[54] PACKAGE STACK VIA BOTTOM LEADED PLASTIC (BLP) PACKAGING

[75] Inventor: Patrick W. Tandy, Boise, Id.

[73] Assignee: Micron Technology, Inc., Boise, Id.

[21] Appl. No.: 09/337,628

[22] Filed: Jun. 21, 1999

Related U.S. Application Data

[62] Division of application No. 08/890,414, Jul. 9, 1997, Pat. No. 5,986,209.

[51] Int. Cl.$^7$ ..................................................... H01L 23/02
[52] U.S. Cl. ......................... 174/52.4; 257/686; 257/693; 257/778
[58] Field of Search ..................................... 257/692, 693, 257/778, 686, 666, 723, 724, 725, 777; 174/52.4, 52.2; 361/773

[56] References Cited

U.S. PATENT DOCUMENTS

| | | |
|---|---|---|
| 3,404,454 | 10/1968 | Sayles . |
| 4,682,270 | 7/1987 | Whitehead et al. . |
| 4,778,641 | 10/1988 | Chia . |
| 5,095,402 | 3/1992 | Hernandez et al. . |
| 5,172,214 | 12/1992 | Casto . |
| 5,200,364 | 4/1993 | Loh . |
| 5,214,845 | 6/1993 | King et al. . |
| 5,331,235 | 7/1994 | Chun . |
| 5,418,189 | 5/1995 | Heinen . |
| 5,436,500 | 7/1995 | Park et al. . |
| 5,466,887 | 11/1995 | Hasegawa . |
| 5,471,369 | 11/1995 | Honda et al. . |
| 5,475,259 | 12/1995 | Kasai et al. . |
| 5,483,024 | 1/1996 | Russell et al. . |
| 5,486,720 | 1/1996 | Kierse . |
| 5,493,153 | 2/1996 | Arikawa et al. . |
| 5,498,902 | 3/1996 | Hara . |
| 5,508,565 | 4/1996 | Hatakeyama et al. . |
| 5,519,251 | 5/1996 | Sato et al. ................................ 257/666 |
| 5,527,743 | 6/1996 | Variot . |
| 5,530,286 | 6/1996 | Murakami et al. . |
| 5,530,292 | 6/1996 | Waki et al. . |
| 5,535,509 | 7/1996 | Tomita et al. . |
| 5,554,823 | 9/1996 | Hasegawa . |
| 5,554,886 | 9/1996 | Song . |
| 5,570,272 | 10/1996 | Variot . |
| 5,572,068 | 11/1996 | Chun . |
| 5,679,978 | 10/1997 | Kawahara et al. . |
| 5,760,471 | 6/1998 | Fujisawa et al. ........................ 257/792 |
| 6,007,317 | 12/1999 | Mess . |

FOREIGN PATENT DOCUMENTS

| | | |
|---|---|---|
| 61-269338 | 11/1986 | Japan . |
| 8-8389 | 1/1996 | Japan . |
| 63-15431 | 1/1998 | Japan . |

OTHER PUBLICATIONS

Samsung DRAM Web Page, High Density DRAMs, 2 pages. No date.

*Primary Examiner*—Kristine Kincaid
*Assistant Examiner*—Hung V Ngo
*Attorney, Agent, or Firm*—Trask Britt

[57] ABSTRACT

A packaged semiconductor device has bottom surface leads having portions of the package adjacent the lead edges excised. The outer leads may take the form of inverted-J leads, short stub leads, vertically bent leads-in-grooves, or may be entirely eliminated. Lead connections are on the bottom package surface, over the top package surface, and/or on the sides and ends of the package, enabling vertical stacking of the devices and simultaneous/alternative coplanar horizontal connections to other semiconductor devices, circuit boards, etc. A mold assembly with a castellated inner surface forms a package with alternating grooves and columns for holding side and end electrical connection surfaces.

2 Claims, 10 Drawing Sheets

PACKAGE STACK VIA BOTTOM LEADED PLASTIC (BLP) PACKAGING

CROSS REFERENCE TO RELATED APPLICATION

This application is a divisional of application Ser. No. 08/890,414, filed Jul. 9, 1997, U.S. Pat. No. 5,986,209.

BACKGROUND OF THE INVENTION

1. Field of the Invention

This invention relates generally to semiconductor devices. More particularly, the invention pertains to surface and external lead configurations of packaged semiconductor devices for electrical connection to other apparatus.

2. State of the Art

The continuing miniaturization of semiconductor devices is crucial to the electronics industry. Numerous improvements have contributed to the industry growth, including the development of leads-over-chips (LOC) assemblies and their inverse, chip-over-leads (COL) configurations. Thus, the die-attach support was eliminated and lead length was reduced, decreasing the package size. Further developments have included packaged devices in which a plurality of dies and leads therefor are encapsulated within a single package. Such is well illustrated, for example, in U.S. Pat. No. 5,331,235 of Chun, U.S. Pat. No. 5,471,369 of Honda et al., U.S. Pat. No. 5,483,024 of Russell et al., U.S. Pat. No. 5,498,902 of Hara, U.S. Pat. No. 5,508,565 of Hatakeyama et al., U.S. Pat. No. 5,530,292 of Waki et al., and U.S. Pat. No. 5,572,068 of Chun.

While such developments have filled a need, there remain applications wherein it is desirable to electrically attach separate, packaged semiconductor devices to each other, and to circuit boards, in combinations providing the desired results. This focuses our attention on the external electrical connections of the package by which it may be connected to other packaged devices, circuit boards, various electrical conduits, and a wide variety of electrical apparatuses.

The state of the art is illustrated by the representative prior art semiconductor devices shown in drawing FIGS. 1–4.

A representative example of a known packaged multi-chip semiconductor device 10 of the piggy-back type is shown in drawing FIGS. 1 and 2. A leads-over-chip (LOC) type construction with a small-outline-J-lead (SOJ) type package is depicted. The device includes a semiconductor chip or die 12 partially overcovered with an insulating layer(s) 14 such as polyimide. The die 12 includes a plurality of pads 16, each of which is electrically connected to a wire 18 whose opposite end is electrically connected to an end of an inner lead 20 of a leadframe. The die 12, insulative layers 14, wires 18, and inner leads 20 are enclosed in plastic 22, typically by a transfer molding process.

As shown in drawing FIG. 2, several packaged devices 10 of drawing FIG. 1 may be stacked with their outer leads 24 connected by e.g. soldering to form a multi-chip package 26. As indicated, device 10B is superposed on device 10A and corresponding outer leads 24A and 24B of the devices are joined by soldering to provide a piggy-back type of package 26. The end portions 28 of the outer leads 24B are joined to the outer leads 24A.

This type of construction has several disadvantages. First, the outer leads 24B of the superposed device 10B must be bent differently from outer leads 24A of the underlying device 10A. Thus, the devices 10A and 10B cannot be interchanged, and the outer leads 24B of device 10B are not configured for attachment to a PCB.

In addition, each device 10C, 10D (not shown) to be stacked atop device 10B requires a different outer lead configuration to enable proper joining of the stacked devices.

Turning now to drawing FIG. 3, a prior art semiconductor device 30 is depicted in which two dies 12C, 12D are combined, face-to-face, and joined to opposing sides of a single leadframe 32. The inner lead ends 34A which approach the electrical pads 16 from one side are positioned between the inner lead ends 34B which approach the pads 16 from the opposite side. Layers 38 of insulative material separate the dies 12C, 12D and leadframe 32 from each other generally. The combination of dies 12C, 12D and the attached leadframe 32 is encapsulated by plastic 22 within a single small-outline-J-lead (SOJ) package with conventional outer J-leads 36.

Drawing FIG. 4 illustrates a prior art semiconductor device 40 shown in U.S. Pat. No. 5,554,886 of Song. The device 40 may be vertically stacked in multiple units. A die 12 is wire-bonded to inner leads 42 of a leadframe 32. The inner leads 42 are configured to have metal laminates 43 joined thereto, wherein surface portions 44 of the laminates are coplanar with a first major surface 46 of the plastic package 48 and are meant to comprise bond areas for solder bonding to additional packages. The outer leads 36 have ends 52 which are formed to be parallel to the second major surface 50, opposite to first major surface 46. Each lead end 52 has a surface 54 for bonding to a circuit board or another device package. Thus, multiple units of the device 40 may be stacked and have corresponding surface portions 44 and 54 joined by solder.

Although the state of the art in package configuration is continually improving, ever-increasing demands for further miniaturization, circuit complexity, production speed, reduced cost, product uniformity and reliability require further improvements in semiconductor device connections by which the devices are readily electrically connected to circuit boards, electrical apparatus, and each other.

In particular, the need for a semiconductor device capable of electrical connection to a plurality of substrates, other devices, or various electrical apparatus in several configurations is presently needed.

SUMMARY OF THE INVENTION

In accordance with the invention, a package configuration for a semiconductor device is formed wherein the package size is reduced, stacking of packages is enabled without further modification of a lower or upper package, and the bonding of the device to electrical apparatuses is enhanced.

The external package configuration may be used with any internal configuration of dice, leads, insulative layers, heat sinks, die-to-lead connections, etc. Thus, the internal assembly configuration may comprise a Leads-Over-Chip (LOC), Chip-Over-Leads (COL), single or multiple die, wire bonded leads and/or tape-automated bonding (TAB) as well as other variations or combinations in construction.

A semiconductor package is formed in which the conductive lead has an intermediate portion which is encapsulated to have its exposed surface coplanar with the bottom surface of the package.

The outer lead is then an outward extension of the intermediate portion. The intermediate portion provides a bonding surface for joining to a circuit board, device, etc. In a further improvement of the invention, the encapsulant adjacent the edges of the intermediate lead portion is excised to a depth equaling about 0.1–1.0 of the lead thickness. The excised portion may take a variety of configurations.

In another improvement, the semiconductor device is formed with subsurface intermediate leads by which the leads of apparatus being connected are properly positioned by chamfered sides.

In another improvement, a semiconductor package is formed with castellated sides and/or ends whereby the outer leads are bent upwardly to fit in the castellation grooves, while extending slightly from the grooves to provide bonding sites for electrical connection to other devices, etc. A mold assembly is described, infra, for producing the castellated package.

BRIEF DESCRIPTION OF THE SEVERAL VIEWS OF THE DRAWINGS

The invention is illustrated in the following figures, wherein the elements are not necessarily shown to scale.

DETAILED DESCRIPTION OF THE INVENTION

A new semiconductor device and method of production thereof is provided by the invention. The semiconductor device is a small footprint semiconductor package amenable to alternative conductive connection (a) in a multi-package vertical stacking configuration, (b) in a multi-package horizontal layout, and (c) to a printed circuit board (PCB) or other substrate.

Figure 1:
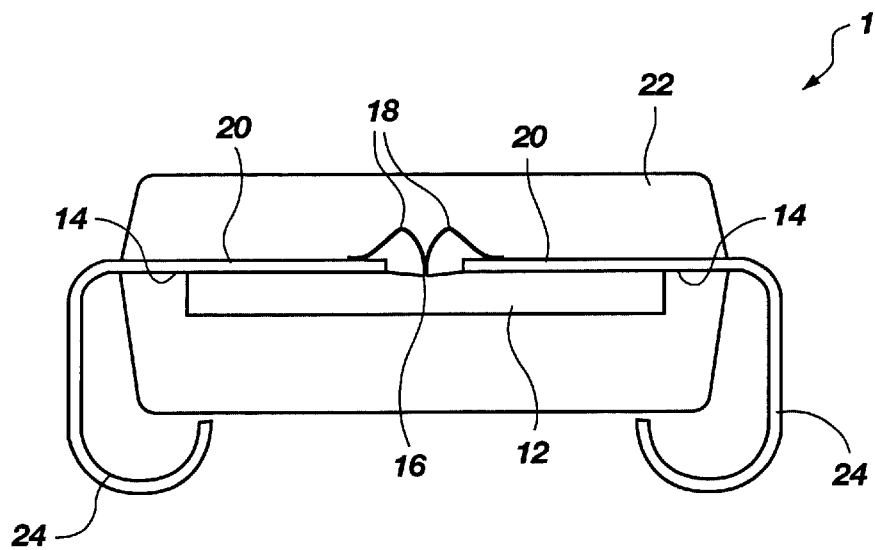
FIG. 1 is a cross-sectional end view showing a construction of a semiconductor package of the prior art.
Figure 2:
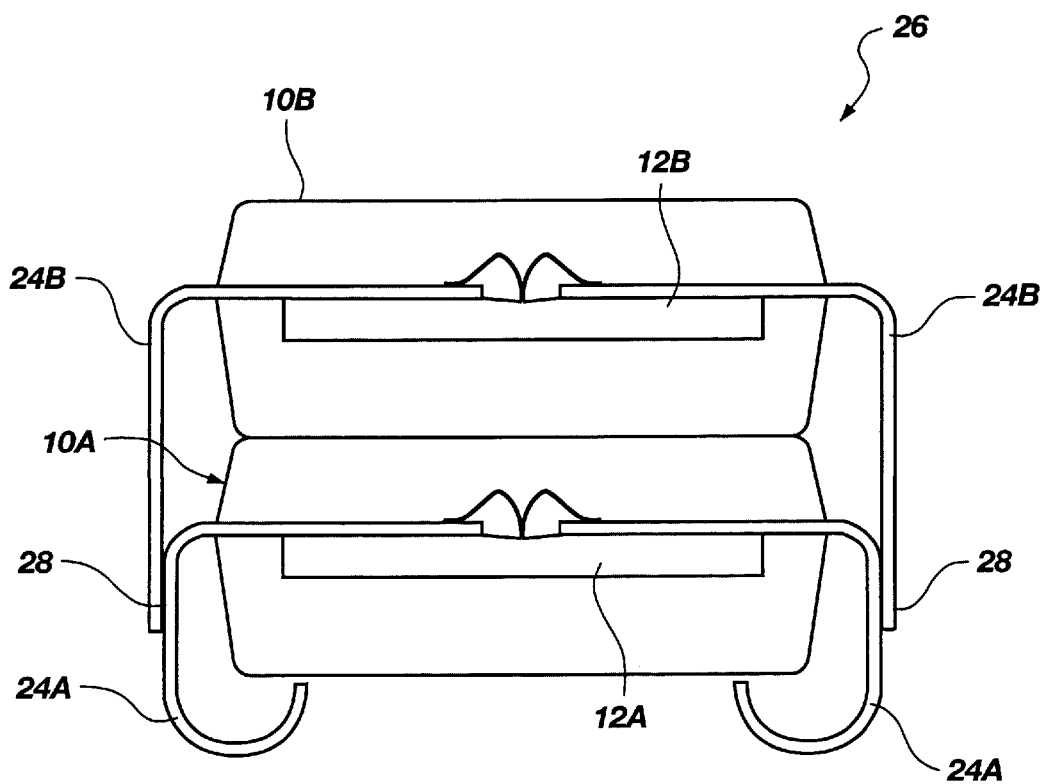
FIG. 2 is a cross-sectional end view showing a construction of a prior art multi-chip semiconductor device comprising a plurality of the packages of FIG. 1 having their outer leads joined.
Figure 3:
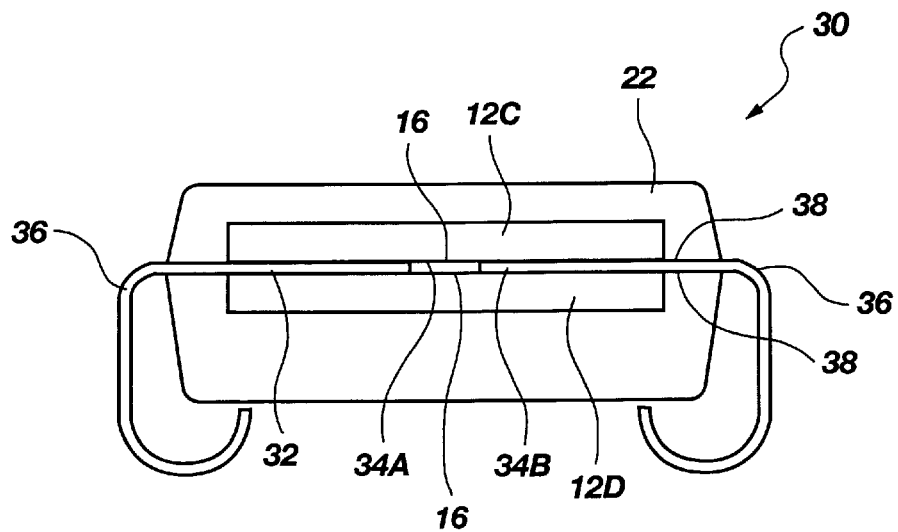
FIG. 3 is a cross-sectional end view of a construction of a multi-die semiconductor package illustrative of the prior art.
Figure 4:
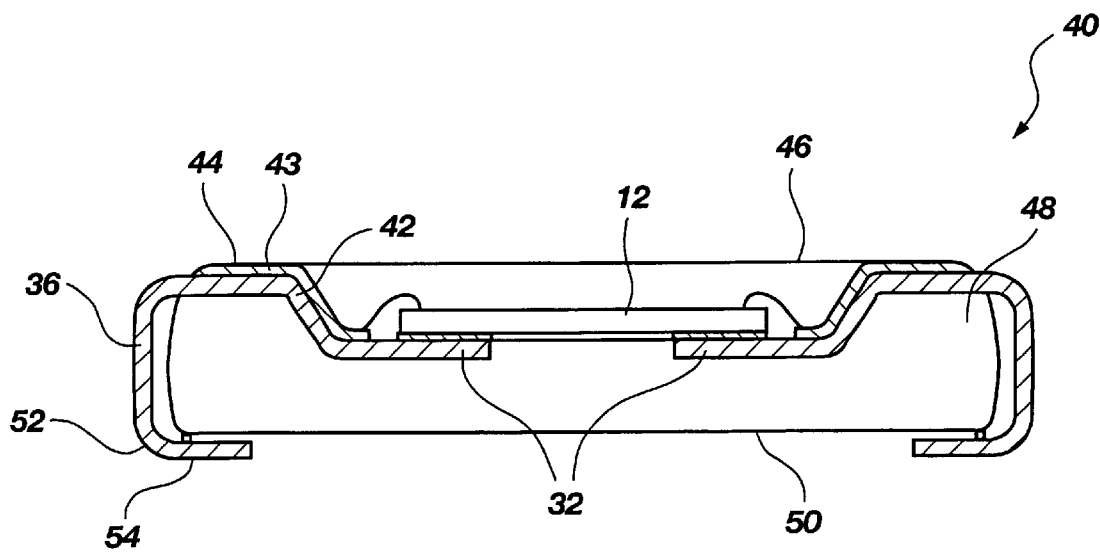
FIG. 4 is a cross-sectional end view of a construction of a prior art semiconductor package configured for multiple stacking.
Figure 5:
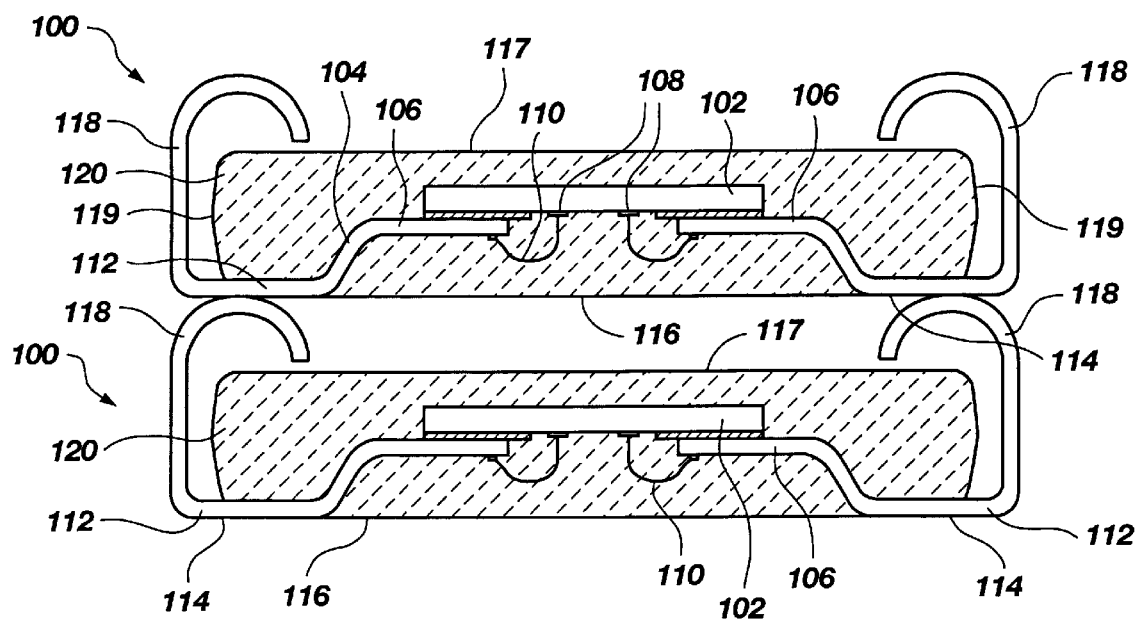
FIG. 5 is a cross-sectional end view of two bottom-leaded packaged semiconductor devices of the invention in a stacked configuration.
Figure 6:
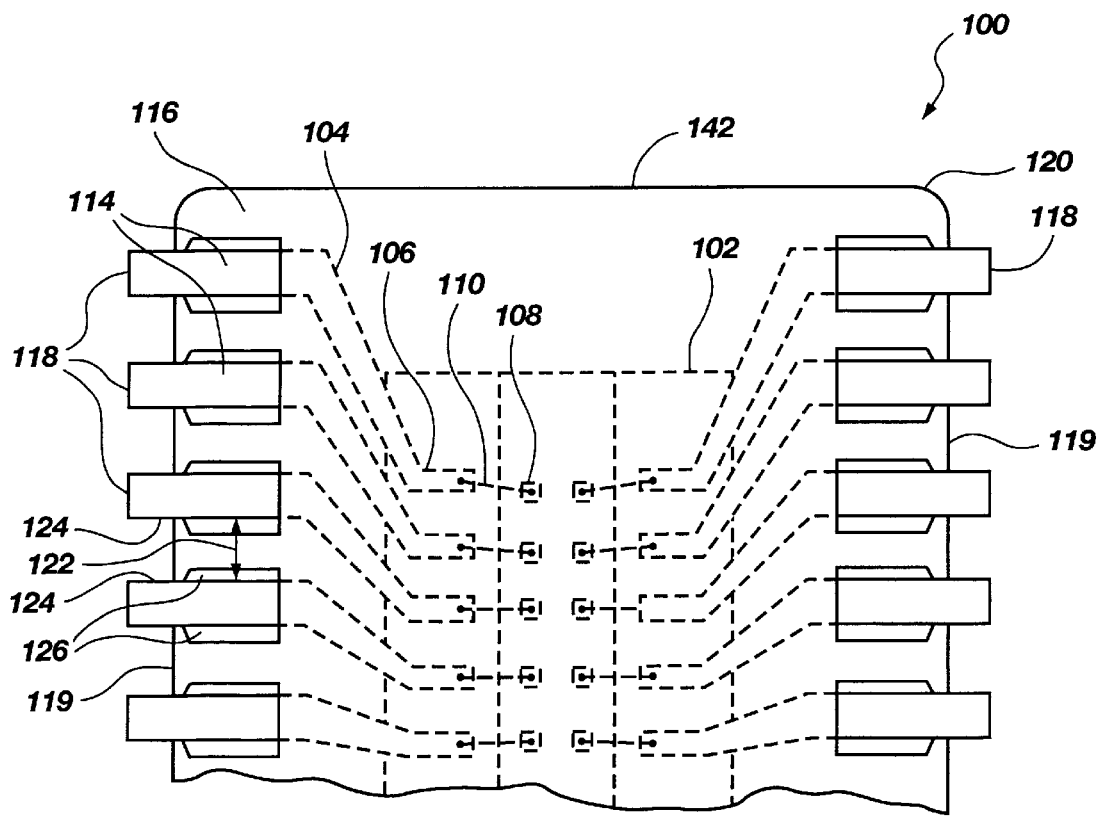
FIG. 6 is a partial bottom view of a bottom-leaded packaged semiconductor device of the invention.

With reference to the drawings of FIGS. 5–18 which describe the instant invention, and particularly to FIGS. 5 and 6, a pair of semiconductor devices 100 are shown in cross-section. In each device 100, the particular configuration of die 102, metallized lead frame 104, and die-to-lead attach method may be any of the wide variety of known constructions in the art. As represented in FIGS. 5 and 6, a chip-over-leads (COL) interior construction with inverted-J (IJ) outer leads 118 is shown with inner leads 106 conductively connected to die pads 108 by wires 110. An intermediate lead portion 112 is positioned during encapsulation, e.g. transfer molding, to have a bottom lead surface 114 generally coplanar with the bottom package surface 116 of the molded polymer package 120. The bottom lead surface 114 of the intermediate lead portion 112 of each lead comprises a bonding surface for conductive connection to a semiconductor device, a circuit board, or other conduit or electrical apparatus. Each lead is separated from adjacent leads by a spacing 122 which may vary along the length of the lead. Preferably, the spacing 122 of the outer leads 118 is uniform.

As defined herein, the inner leads 106 are completely enclosed within the polymeric package 120. The outer leads 118 are completely outside of the package 120, and the intermediate lead portions 112, as formed, are within the bottom surface 116 of the package 120 and have a bottom lead surface 114 exposed. The outer leads 118, shown as inverted-J (IJ) leads, of one device 100 may be joined to the intermediate lead portions 112 of another device if desired, or either the outer leads or intermediate lead portions may be joined to a circuit board, other electrical conduits, or another electrical apparatus.

In accordance with certain embodiments of the invention, the spacing 122 of the polymeric package 120 between the edges 124 of the intermediate lead portions 112 is partially cut away along and adjacent to the intermediate lead edges 124, exposing at least a portion of each edge. The excised portions 126 may take several cross-sectional forms, as depicted generally in drawing FIGS. 7B, 7C, 7D or 7E.

Figures 7A, 7B:
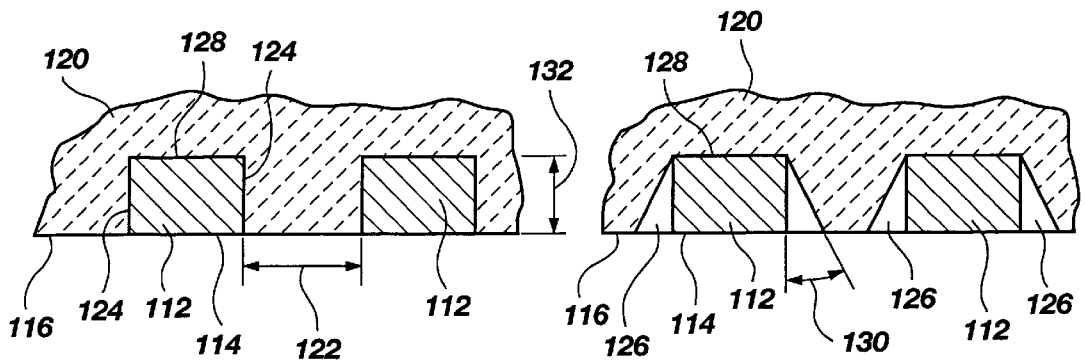
FIGS. 7A–7F are fragmentary enlarged cross-sectional side views through surface leads of differing embodiments of the bottom-leaded packaged semiconductor devices of the invention.

Drawing FIG. 7A shows an intermediate lead portion 112 as formed along within the molded polymer package 120. The bottom lead surface 114 is generally coplanar with the bottom package surface 116, depending upon the precision of lead placement within the mold.

A thin coating of polymer will sometimes cover the bottom lead surface 114 following removal of the device from the mold. In the manufacturing process, this coating will be subsequently removed to permit electrical connection to a conductor. The top lead surface 128 and edges 124 are embedded in the package 120. The lead thickness 132 (typically between about 0.5 and 3 mils) and the lead-to-lead spacing 122 (typically at least about 2–3 mils) are indicated.

In one embodiment of the invention illustrated in drawing FIGS. 5 and 6, further shown in FIG. 7B, the lead-to-lead spacing 122 of the package 120 is chamfered adjacent the full thickness 132 of each lead edge 124 to expose the edges 124. The chamfer angle 130 of the excised chamfer portions 126 may be between about 20 degrees and about 60 degrees, depending upon the available lead-to-lead distance between the intermediate lead portions 112.

Figures 7C, 7D:
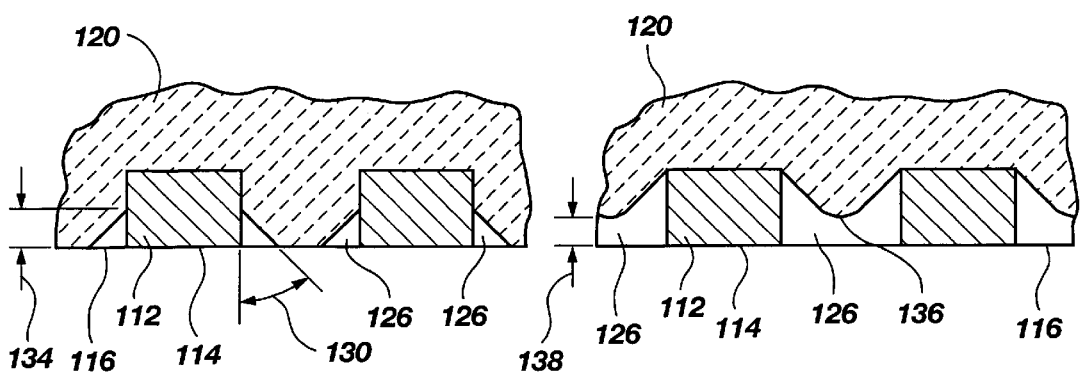

In another embodiment shown in drawing FIG. 7C, the excised chamfer portions 126 are shallower, extending to a depth 134 of as little as only about ⅛ of the lead thickness 132. In drawing FIG. 7C, the depth 134 is shown as about ½ of the lead thickness 132.

In drawing FIG. 7D, a greater portion of the lead-to-lead spacing 122 is removed, by which an interlead ridge 136 of polymeric package material extends downwardly to a distance 138 above the lead bottom surfaces 114. The ratio of distance 138 to lead thickness 132 may be between about zero and about 1.0, although a preferred ratio will be between about 0.1 and about 0.6.

Figure 7E:
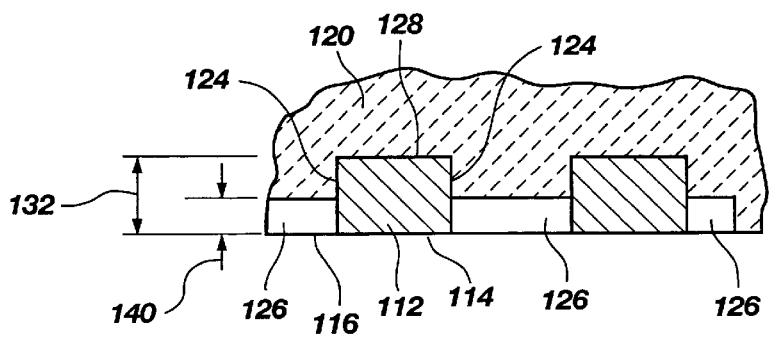

Drawing FIG. 7E shows another embodiment of the invention, in which the lead-to-lead spacing 122 is excised to a generally uniform depth 140. The ratio of depth 140 to the lead thickness 132 may be between about 0.1 and about 0.8, but is preferably between about 0.1 and about 0.6.

Figure 7F:
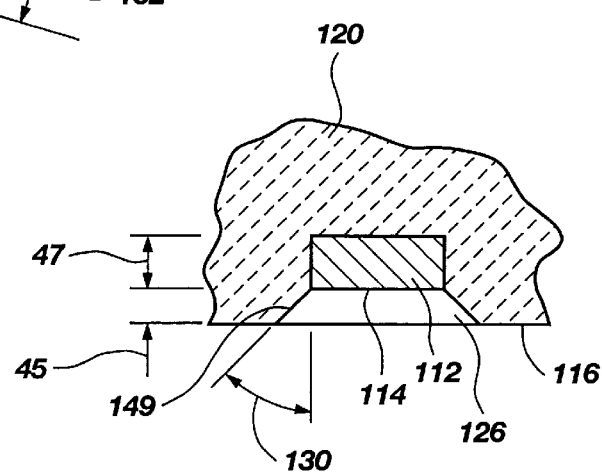

In a further embodiment shown in drawing FIG. 7F, the excision includes not only chamfered portions of the polymer package 120 but the intermediate lead portion 112 itself. Thus, the exposed lead bottom surface 114 of the intermediate lead portion 112 is depressed into the polymer package 120 a distance 45 which is up to about ½ of the original lead thickness 132. The distance 45 is thus at least ½ of the original lead thickness 132. The chamfer angle 130 may be between about 20 degrees and 60 degrees, and more preferably about 30–45 degrees. This embodiment results in easier alignment of other leads which are to be joined to the intermediate lead portions 112, the chamfer walls 149 acting as retainers of the inserted lead edges, not shown.

Use of bottom leads along the sides of a semiconductor package, together with excision of polymeric material from between the bottom leads, provides a number of improvements. For instance, the device 100 may be electrically joined to another device, piggy-back style, which is already joined to e.g. a circuit board. Or, the device occupies a smaller amount of area for mounting purposes on a substrate.

Figure 8:
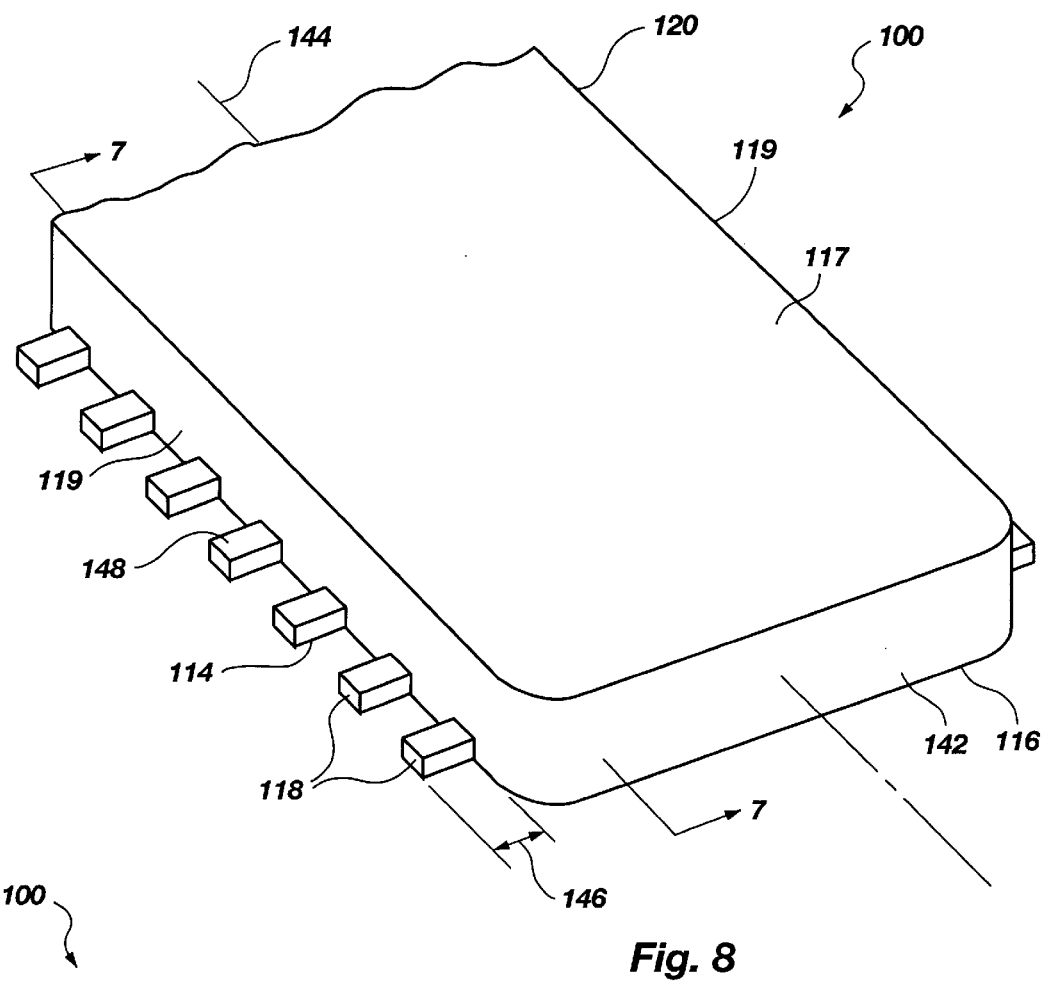
FIG. 8 is a partial perspective view of another embodiment of a bottom-leaded packaged semiconductor device of the invention.
Figure 9:
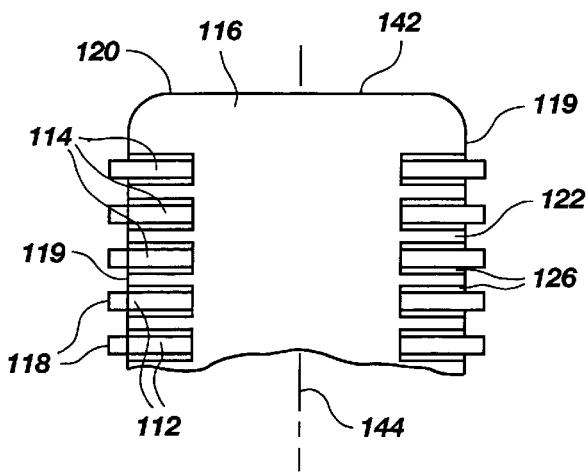
FIG. 9 is a partial bottom view of the bottom-leaded packaged semiconductor device of FIG. 8.

Turning now to drawing FIGS. 8 and 9, another version of the improved semiconductor device 100 is shown as a package 120 having a top surface 117, a bottom surface 116, two sides 119, and ends 142. A general central axis 144 passes lengthwise through the package 120.

In this version, the outer leads 118 are truncated horizontal extensions of the intermediate bottom lead portions 112, extending a short distance 146 outwardly, generally no more than about 8 to about 30 mils from the package sides 119. Preferably, distance 146 is between about 10 and about 20 mils. The outer leads 118 have several surfaces which may be electrically connected to other leads or apparatus, including the upper lead surface 148 and the bottom lead surface 114.

The semiconductor device 100 illustrated in drawing FIGS. 8 and 9 may incorporate excision of the polymer package 120 along and adjacent the intermediate lead edges 124. Thus, any of the general excision shapes illustrated in drawing FIGS. 7B through 7E may be used, in addition to the version of the invention illustrated in drawing FIG. 7A not having excised chamfer portions 126.

Figure 10:
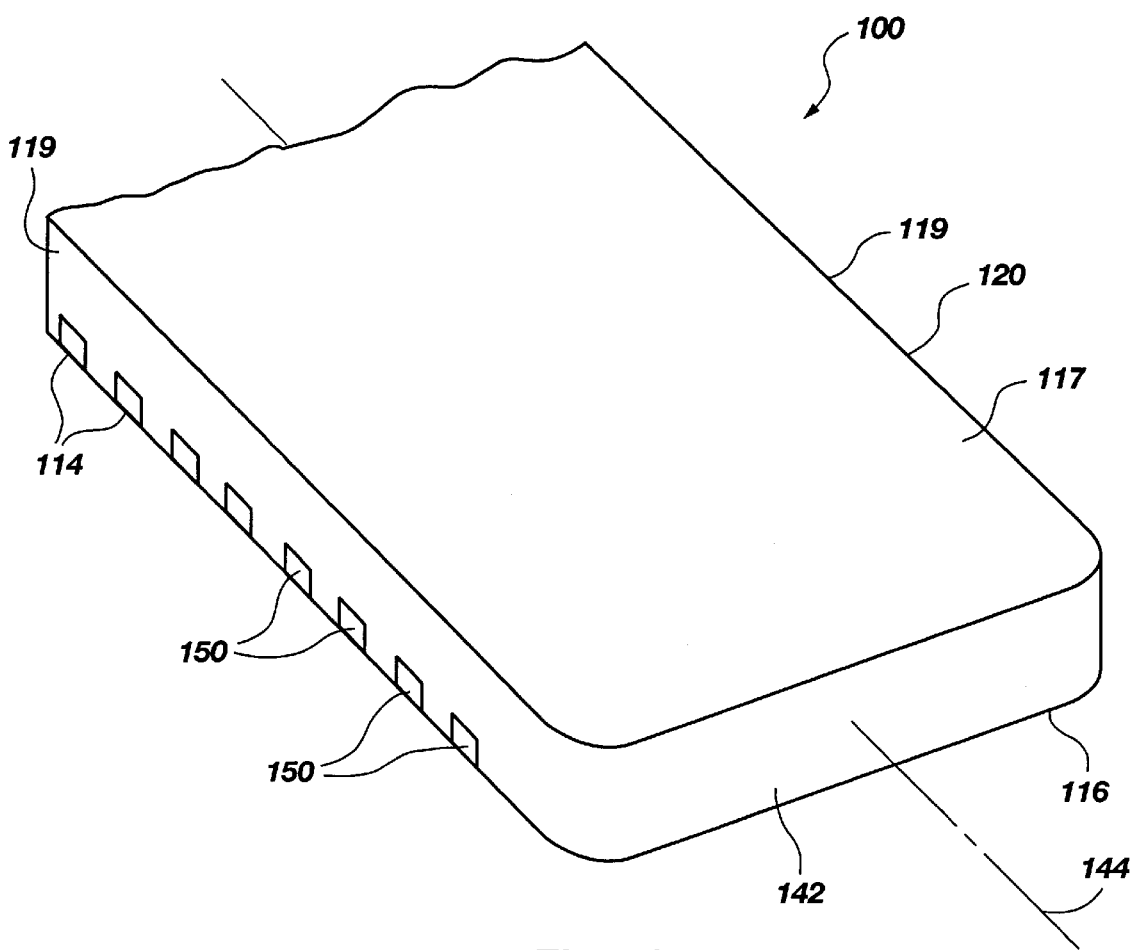
FIG. 10 is a partial perspective view of a further embodiment of a bottom-leaded packaged semiconductor device of the invention without external leads.
Figure 11:
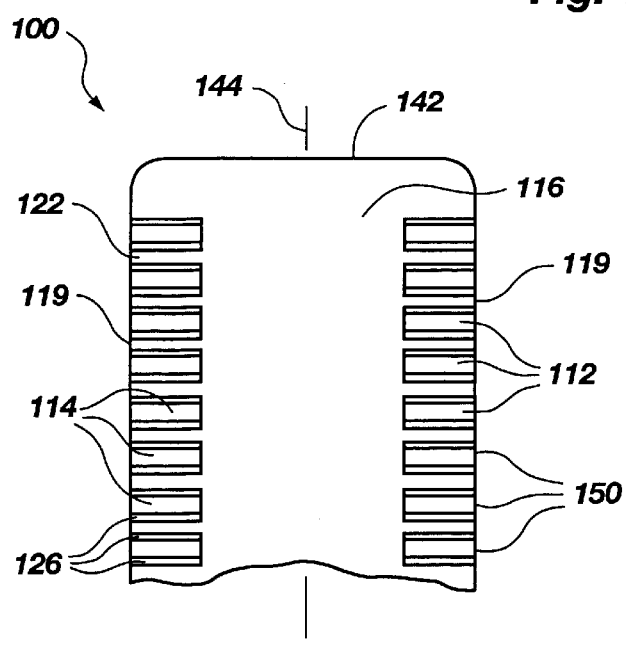
FIG. 11 is a partial bottom view of the bottom-leaded packaged semiconductor device of FIG. 10.

The semiconductor device 100 of drawing FIGS. 10 and 11 is similar to that illustrated in drawing FIGS. 8 and 9, except that it has no "outer" or external leads. Thus, it has the smallest "footprint" of the various embodiments, the footprint being merely the polymer package 120 itself. Electrical connections may be made between the bottom lead surfaces 114 and/or the end surfaces 150 of the intermediate lead portions 112.

Like the embodiments previously described, the embodiment illustrated in drawing FIG. 11 shows portions 126 of the lead-to-lead spacing 122 which have been excised or removed in accordance with the embodiments illustrated in drawing FIGS. 7B through 7E to provide the advantages previously outlined.

Figure 12:
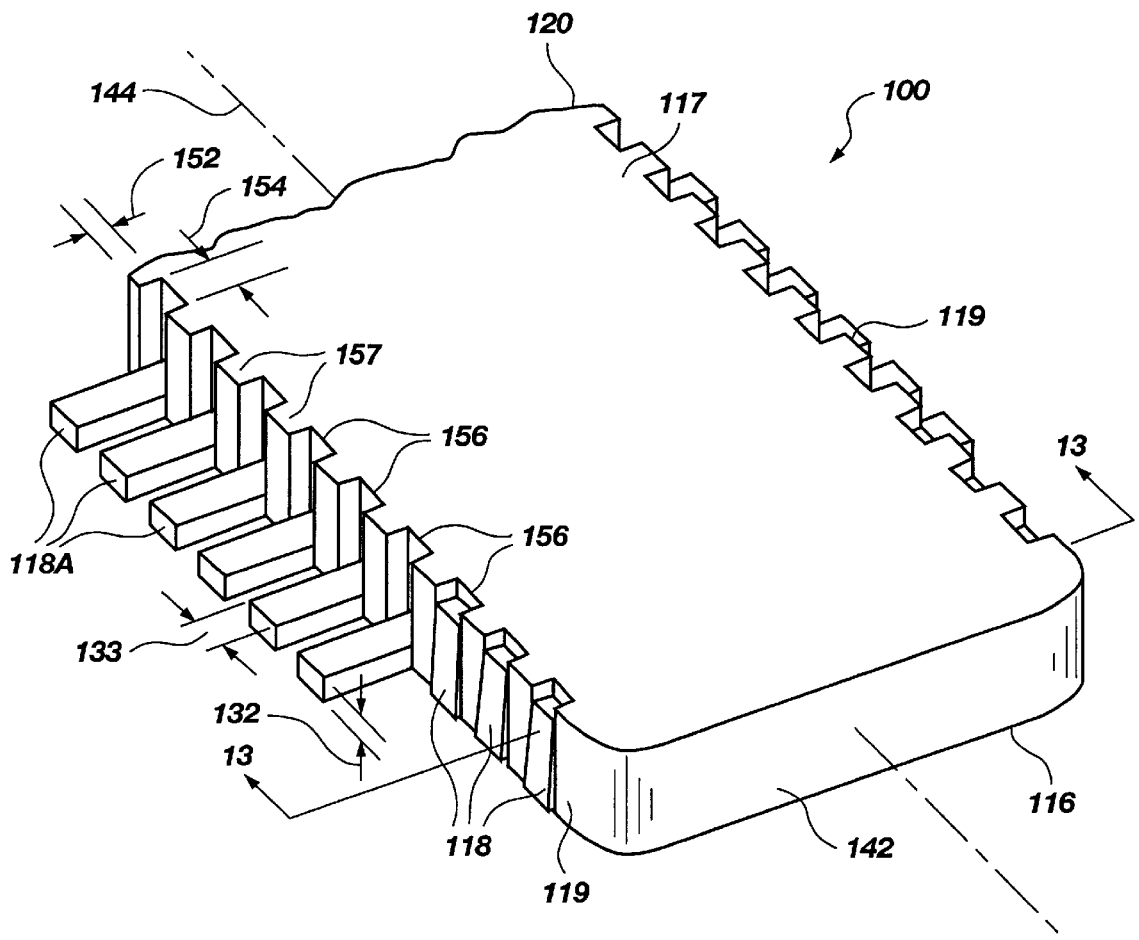
FIG. 12 is a partial perspective view of an additional embodiment of a bottom-leaded packaged semiconductor device of the invention.
Figure 13:
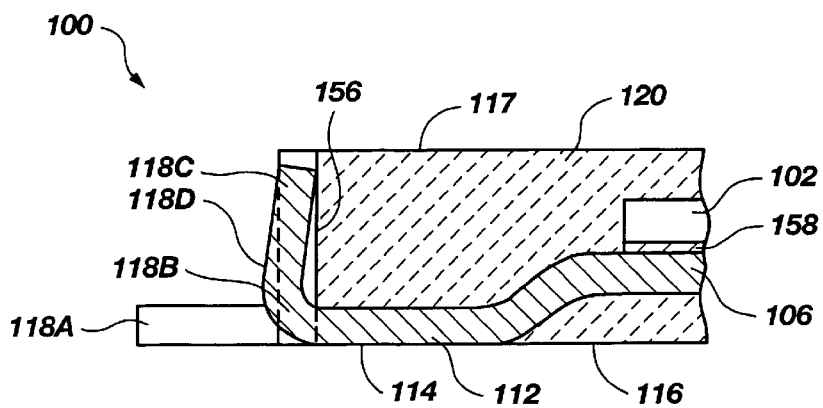
FIG. 13 is a partial cross-sectional end view of the bottom-leaded packaged semiconductor device of FIG. 12, as taken along line 13—13 thereof.

Turning now to drawing FIGS. 12 and 13, a small-footprint semiconductor device 100 is shown with intermediate lead portions 112 having bottom lead surfaces 114 generally coplanar with the polymeric bottom surface 116 of the molded package 120. The package 120 has a vertical groove 156 aligned with each outer lead 118 such that the outer lead may be bent upwardly to fit within the groove. Between each groove 156 is a column 157 of the package 120. Thus, the semiconductor device 100 will be no larger, or just barely larger, than the molded package 120.

As shown in drawing FIGS. 12 and 13, outer leads 118A from the transfer molding process extend outwardly from the molded package 120. Vertical grooves 156 are premolded or formed after removal from a mold. Each outer lead 118A is bent upwardly at bend 118B. The outer end 118C is closely fitted within the groove 156 near the top surface 117 of the molded package 120, and a portion 118D of the lead in the area of bend 118B typically extends a short distance outwardly from the groove to provide a bonding surface for lateral electrical connection to another semiconductor device, electrical conduit, or electrical apparatus. Each groove 156 is shown as extending to the top surface 117 of the package 120, with a groove depth 152 generally about equal to the lead thickness 132, and a groove width 154 slightly larger than the lead width 133, whereby the outer lead 118 will readily fit into the groove 156. Thus, the semiconductor device 100 has "surface" leads both on its bottom surface 116 and on surfaces of the sides 119 and/or ends 142.

Portions of surface 114 which are to be bottom bonded may have adjacent package portions 126 excised or removed as previously described in accordance with the embodiment illustrated in drawing FIGS. 7B–7E.

In drawing FIG. 13, the exemplary interior construction of the packaged device 100 is shown as a chip-over-lead (COL) configuration, with chip or die 102 attached to inner lead 106 with an intervening insulative tape 158. However, as already indicated, the invention relates primarily to the configuration of an intermediate "surface" lead and the outer leads; the invention may be applied to any interior chip-lead configuration for reducing the overall size of the device 100 and providing both bottom and side/end lead bonding surfaces.

Figure 14:
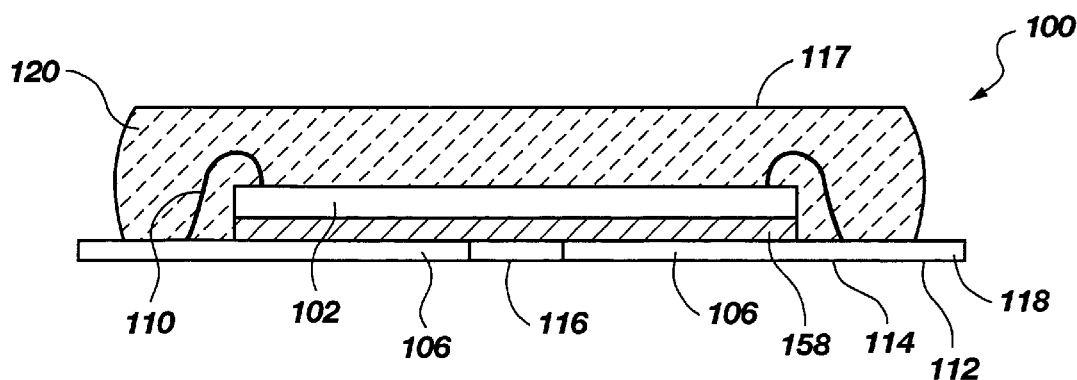
FIG. 14 is a cross-sectional end view of an embodiment of the bottom-leaded packaged semiconductor device of the invention, as taken along line 14—14 of FIG. 15.
Figure 15:
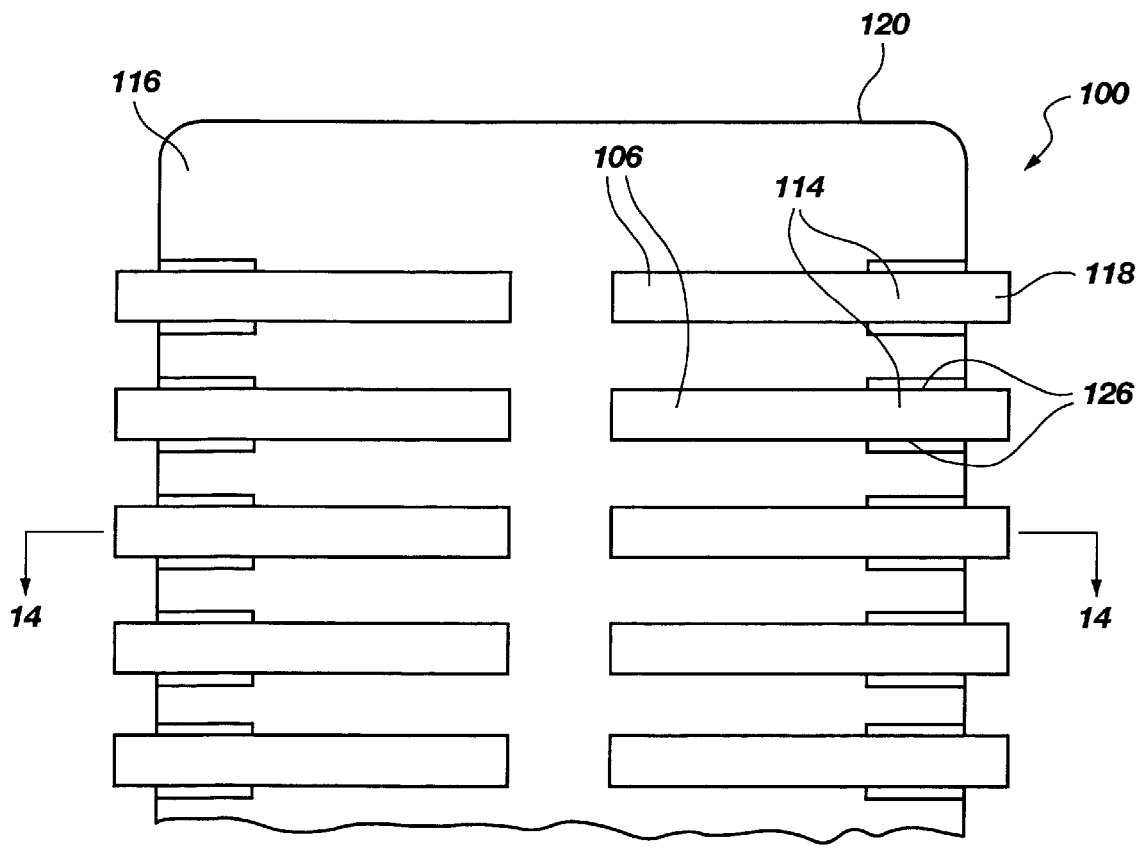
FIG. 15 is a partial bottom view of the bottom-leaded packaged semiconductor device of FIG. 14.

Another embodiment of the packaged semiconductor device 100 is shown in drawing FIGS. 14 and 15. The interior construction is depicted as a chip-over-leads (COL) configuration with wire bonds 110. The entire bottom surface 114 of each inner lead 106 is coplanar with the bottom surface 116 of the package 120. Portions of surface 114 which are to be bottom bonded may have adjacent package portions 126 excised or removed as previously described in accordance with the embodiment illustrated in drawing FIGS. 7B–7E.

While the outer leads 118 are shown as short leads like those of the embodiment of drawing FIG. 8, they may take any useful form such as the inverted-J leads illustrated in drawing FIG. 5, the lateral leads of FIG. 12, or may be eliminated as outer leads as in drawing FIGS. 10 and 11, depending upon the apparatus to which the device 100 is to be connected.

In this embodiment, inner leads 106 are primarily supported by their adhesive attachment to the insulative tape 158.

Figure 16:
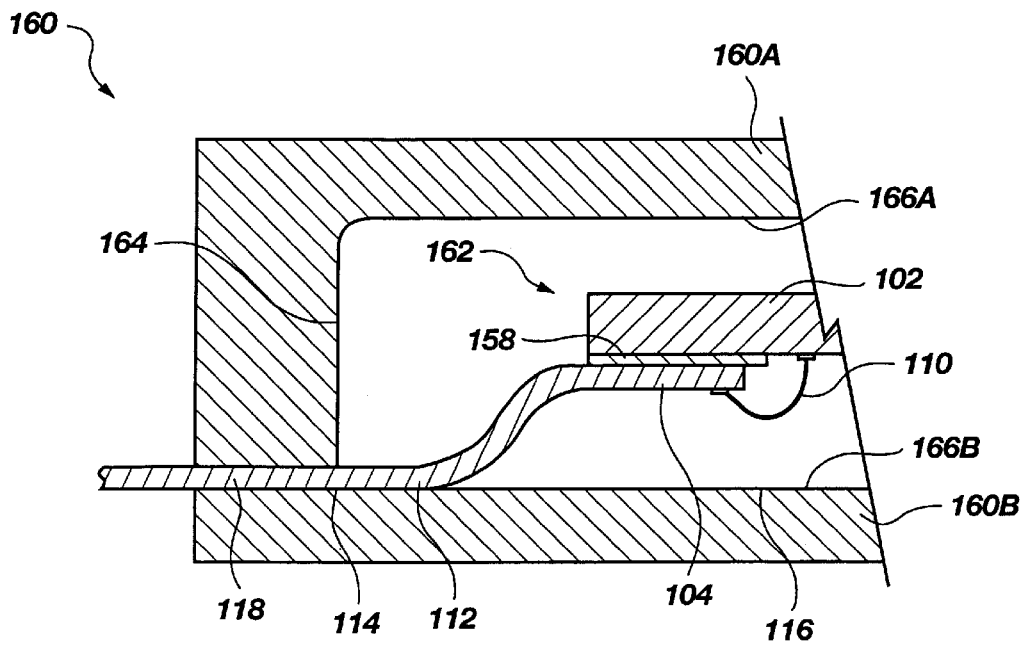
FIG. 16 is a partial end view of a transfer mold assembly for encapsulating a semiconductor device of the invention.

Drawing FIG. 16 shows a mold assembly 160 for encapsulating the die/lead frame assembly 162 in polymer to form the semiconductor package 120. The die/leadframe assembly 162 is shown as including a die 102, leadframe 104, bond wires 110, and insulative tape 158.

The mold assembly 160 includes a top plate 160A and bottom plate 160B which are closed together to form a mold cavity 164 therein.

Mold cavity 164 is defined by an inner surface 166A of the top plate 160A and an inner surface 166B of the bottom plate 160B. A polymeric encapsulant is introduced as a hardenable fluid through openings (not shown) as known in the art.

The top plate 160A and bottom plate 160B are configured to produce a casting or package 120 (see other figures) with an intermediate lead portion 112 and outer lead 118 having bottom surfaces 114 which are coplanar with the bottom surface 116 of the package.

The mold assembly 160 illustrated in drawing FIG. 16 may be used to form the packaged integrated circuit (IC) devices of the invention as described herein. The particular embodiment of FIGS. 12 and 13 may have its alternating pattern of grooves 156 and columns 157 produced after molding by cutting the grooves 156 by an erosion process or other method known in the art. A cutting apparatus having a plurality of spinning saw blades may be used, for example.

Figure 18:
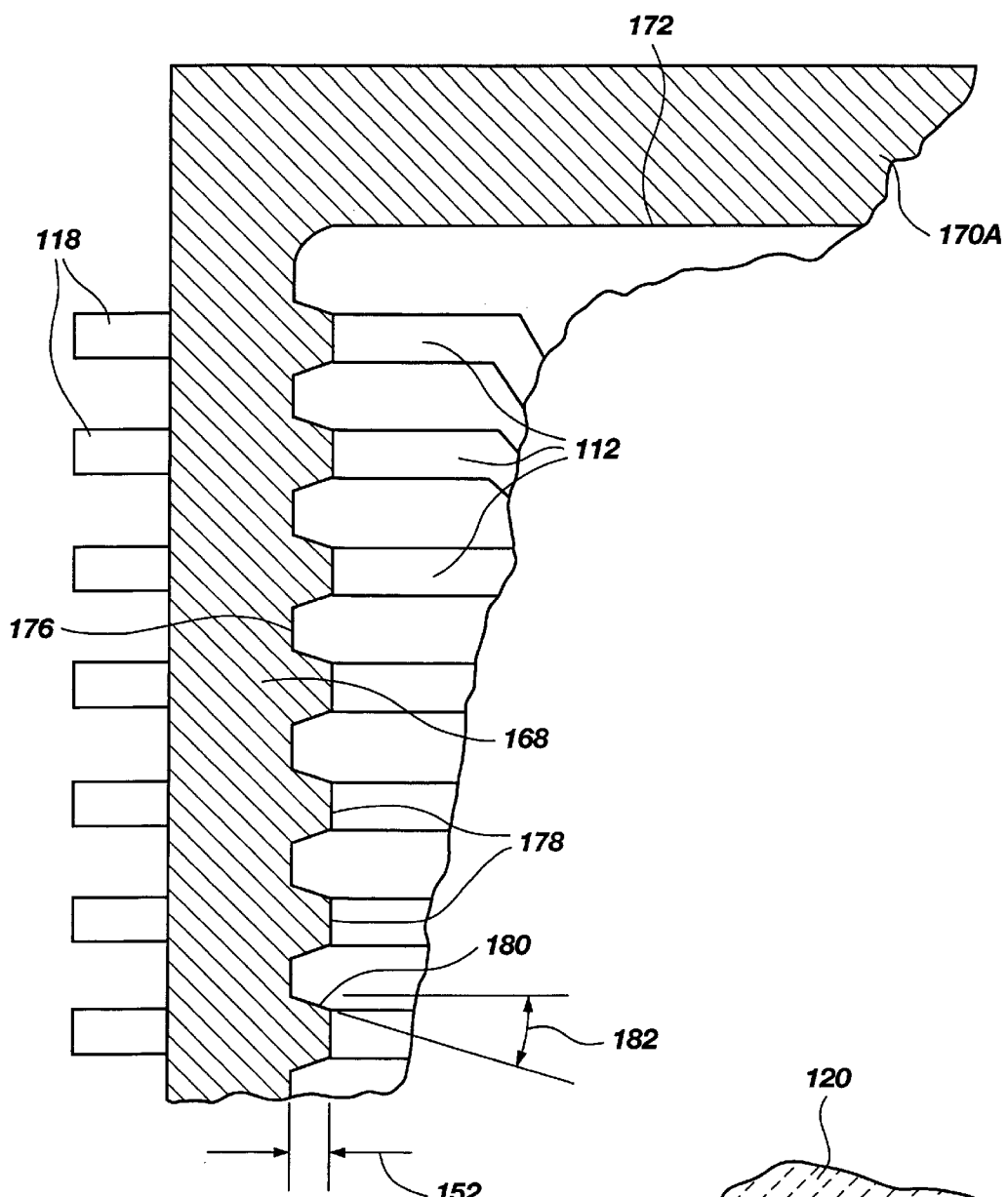
FIG. 18 is a partial cross-sectional plan view through the top plate of a transfer mold assembly of the invention, as taken along line 18—18 of FIG. 17.
Figure 17:
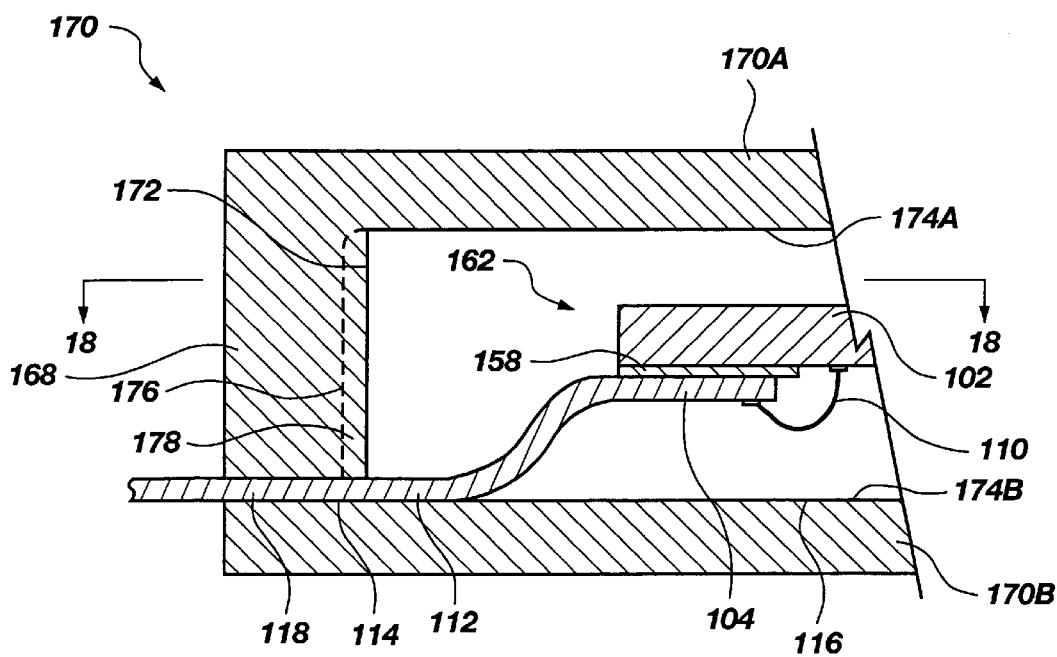
FIG. 17 is a partial end view of a transfer mold assembly of the invention for encapsulating a semiconductor device with a castellated package for enclosing outer leads.

However, the particular groove/column pattern may also be produced in the molding step, using a mold assembly 170 as illustrated in drawing FIGS. 17 and 18. A wall 168 of the top plate 170A which is intersected by intermediate lead portions 112 has a pattern of alternating mold grooves 176 and mold columns 178. During the molding process, the mold grooves 176 are filled with encapsulant and become the package columns 157. Likewise, the spaces occupied by the mold columns 178 become the package grooves 156 into which the outer leads 118 are bent upwardly.

While drawing FIG. 12 depicts the package grooves 156 with square corners, the preferred mold grooves 176 have angled groove sides 180 for easy release of the hardened package from the mold cavity 172. The groove angle 182 may be any angle which permits rapid package release, but will generally be in the range of 5–15 degrees, depending upon the surface roughness of the mold cavity 172 and the particular encapsulant being used.

In the manufacture of the semiconductor devices 100 of the invention, the steps involved include:

a. forming a leadframe with leads for the device;
b. preparing a die-leadframe assembly including electrical connections between the die and leadframe, any insulative layers, heat sink, etc.;
c. aligning the die-leadframe assembly within a mold assembly configured in accordance with the invention by which bottom leaded portions have a bottom surface coplanar with the bottom of the package;
d. closing the mold assembly and injecting fluid polymeric encapsulant to fill the mold cavity;
e. curing the encapsulant and removing the package from the mold;
f. deflashing the bottom of the package and portions of the outer leads to remove flash residue from attachment areas of the leads;
g. lancing the leadframe to singulate the outer leads and/or intermediate lead portions; and
h. bending (if necessary) the outer leads to the specified configuration.

Following step f, the attachment areas of the leads may be plated with e.g. tin to enhance adhesion in a subsequent solder bonding step.

Where a package of the embodiment of drawing FIGS. 12 and 13 is to be fabricated using cutting means to create the vertical grooves 156 in the package 120, such step will typically follow one of steps e, f, or g.

Where a package of the embodiment of drawing FIGS. 12 and 13 is to be fabricated using a top mold plate 170A with an inner castellated wall 168, the deflashing step may include deflashing of the grooves 156 in the package, as well as connection surfaces of the outer leads 118.

Where portions of the package adjacent the intermediate lead portions are to be removed, an erosion process or other method known in the art may be used. This step will follow removal from the mold step e or a subsequent step.

In the lancing/singulation step, the outer leads are cut in conformance to the particular embodiment, as illustrated in drawing FIG. 5 (full inverted J-leads), FIG. 8 (abbreviated leads), FIG. 10 (leads cut at package surface), and FIG. 12 (abbreviated lead length).

This discussion and these figures presume and show a relatively exacting removal of polymeric packaging material from adjacent the leads. As is well known in the art, the methods of removing such material at the miniature scale will not generally leave precisely flat surfaces or uniform depths and angles. The embodiments of drawing FIGS. 7B–7E are representative only and illustrate preferred constructions.

As described herein, the invention provides a semiconductor package of reduced size, yet having leads for bottom and side/edge bonding or bottom and top bonding of the package. Thus, multiples of the device may be vertically stacked in parallel, and/or be electrically joined in a generally horizontal coplanar configuration. The invention may be applied to a three-dimension-lead (TDL) package having outer leads on the ends as well as the sides or top, together with bottom surface leads. The die/leadframe assembly shown and described herein is exemplary only, and may include other elements such as additional dies and leadframes, heatsinks, dielectric layers, etc., as known in the art.

It is apparent to those skilled in the art that various changes and modifications may be made in the packaging methods and products of the invention as disclosed herein without departing from the spirit and scope of the invention as defined in the following claims.

What is claimed is:

1. A bottom-leaded packaged semiconductor device assembly, comprising:

a semiconductor die;
a lead frame including at least one lead with upper, lower and edge surfaces, said at least one lead comprising:
an inner lead conductively connected to said semiconductor die;
an intermediate portion configured for connection to a first electrical apparatus; and
an outer lead configured for connection to a second electrical apparatus, said outer lead configured as a truncated coplanar outward extension of said intermediate lead portion; and a package enclosure enclosing said semiconductor die and the inner lead of said at least one lead, said package enclosure having top, bottom and side surfaces, a bottom surface of said intermediate portion of said at least one lead being generally coplanar with said bottom surface of said package enclosure and exposed for electrical connection to a lead of another electrical apparatus, portions of the package enclosure adjacent the edges of said intermediate portion of said at least one lead being excised to expose at least a portion of said lead edge surface of said edges of said at least one lead.

2. A bottom-leaded packaged semiconductor device assembly, comprising:

a semiconductor die;

a lead frame including at least one lead with upper, lower and edge surfaces, said at least one lead comprising:
an inner lead conductively connected to said semiconductor die;
an intermediate portion configured for connection to a first electrical apparatus; and
an outer lead configured for connection to a second electrical apparatus, said outer lead configured as a truncated coplanar outward extension of said intermediate lead portion; and a package enclosure enclosing said semiconductor die and the inner lead of said at least one lead, said package enclosure having top, bottom and side surfaces, a bottom surface of said intermediate portion of said at least one lead being generally coplanar with said bottom surface of said package enclosure and exposed for electrical connection to a lead of another electrical apparatus, the generally coplanar bottom surface of said intermediate portion being excised to submerge said bottom surface into said bottom surface of said package enclosure.

* * * * *

UNITED STATES PATENT AND TRADEMARK OFFICE
CERTIFICATE OF CORRECTION

PATENT NO. : 6,166,328
DATED : December 26, 2000
INVENTOR(S) : Patrick W. Tandy

It is certified that error appears in the above-identified patent and that said Letters Patent is hereby corrected as shown below:

Column 1,
Line 4, change "CROSS REFERENCE" to -- CROSS-REFERENCE --;
Line 48, "insulating" to -- insulative --;
Line 57, after "by" and "e.g." insert -- , --;
Line 68, change "PCB" to -- printed circuit board (PCB) --;

Column 2,
Line 25, after "have" insert -- lead --;
Line 55, after "(TAB)" insert -- , --;

Column 3,
Line 3, after "of" insert -- the --;

Column 4,
Line 19, change "lead frame" to -- leadframe --;
Line 38, after "of the" insert -- polymeric --;
Line 40, after "bottom" insert -- package -- and after "the" insert -- polymeric --;
Line 43, after "device" insert -- , -- ;
Line 48, after "between the" insert -- lead --;
Line 51, after "excised" insert -- chamfer --;
Line 55, delete "along";
Line 63, after "and" insert -- lead --;
Line 64, after "in the" to -- polymeric --;

Column 5,
Line 1, after "of the" insert -- polymeric --;
Line 2, after "full" and "the" insert -- lead --;
Line 15, change "lead bottom surfaces" to -- bottom lead surfaces --;
Line 27, change "lead bottom surface" to -- bottom lead surface --;
Line 29, after "½" insert -- (indicated as remaining lead thickness 47) -- ;
Line 42, after "to" and "e.g." insert -- , --;
Line 47, before "package" insert -- polymeric -- and after "bottom" insert -- package --;
Line 48, after "two" insert -- package --;
Line 49, after "the" insert -- polymeric --;
Line 51, delete "bottom";

UNITED STATES PATENT AND TRADEMARK OFFICE
CERTIFICATE OF CORRECTION

PATENT NO. : 6,166,328
DATED : December 26, 2000
INVENTOR(S) : Patrick W. Tandy

It is certified that error appears in the above-identified patent and that said Letters Patent is hereby corrected as shown below:

Column 6,
Line 8, before "portions" insert -- excised chamfer --;
Line 16, delete "polymeric" and after "bottom" insert -- package --;
Line 17, before "package" (both occurrences) insert -- polymeric --;
Line 20, after "the" insert -- polymeric --;
Line 22, after "molded" insert -- polymeric --;
Line 25, after "molded" insert -- polymeric --;
Line 28, before "groove" insert -- vertical --;
Line 29, after "molded" insert -- polymeric --;
Line 34, before "groove" insert -- vertical --;
Line 35, after "the" insert -- polymeric --;
Line 38, before "groove" insert -- vertical --;
Line 40, after "bottom" and before "sides" insert -- package --;
Line 42, after "of" insert -- bottom lead --;
Line 43, delete "package" and insert -- excised chamfer -- therefor;
Line 46, change "FIG. 13" to -- FIGS. 13 and 14 --;
Line 58, change "wire bonds" to -- wires -- and after "bottom" insert -- lead --;
Line 59, after "bottom" insert -- package --;
Line 60, after "the" insert -- polymeric -- and after "Portions of" insert -- bottom lead --;
Line 61, after "adjacent" change "package" to --chamfer --;

Column 7,
Line 10, change "die/lead frame" to -- die/leadframe --;
Line 13, delete "bond";
Line 25, after "bottom" (1$^{st}$ occurrence) insert -- lead --;
Line 31, before "grooves" insert -- vertical --;
Line 32, before "grooves" insert -- vertical --;
Line 38, after "170A" insert -- , --;
Line 39, after "112" insert -- , --;
Line 56, change "die-leadframe" to -- die/leadframe --;
Line 59, change "die-leadframe" to -- die/leadframe --;

Column 8,
Line 9, after "with" and "e.g." insert -- , --;
Line 13, after "the" insert -- polymeric --; and
Line 23, change "step e" to -- (step e) --.

UNITED STATES PATENT AND TRADEMARK OFFICE
CERTIFICATE OF CORRECTION

PATENT NO. : 6,166,328
DATED : December 26, 2000
INVENTOR(S) : Patrick W. Tandy

It is certified that error appears in the above-identified patent and that said Letters Patent is hereby corrected as shown below:

Column 9,
Line 16, change "lead frame" to -- leadframe --;
Line 17, change "edge" to -- side --;

Column 10,
Line 4, change "configured as a" to -- extending horizontally from --;
Line 5, delete "truncated coplanar outward extension of"
Lines 9-10, change "a bottom" to -- the lower --;
Line 11, delete "being" and change "coplanar" to -- extending --;
Line 14, delete "generally coplanar";
Line 15, change "intermediate portion" to -- package enclosure --; and
Line 16, change "bottom surface into" to -- lower surface of the intermediate portion into --.

Signed and Sealed this

Eighteenth Day of June, 2002

*Attest:*

JAMES E. ROGAN
*Director of the United States Patent and Trademark Office*

*Attesting Officer*